United States Patent
Kageyama et al.

(10) Patent No.: US 9,618,836 B2
(45) Date of Patent: Apr. 11, 2017

(54) REFLECTIVE MASK BLANK FOR EUV LITHOGRAPHY, SUBSTRATE WITH FUNTION FILM FOR THE MASK BLANK, AND METHODS FOR THEIR PRODUCTION

(71) Applicant: Asahi Glass Company, Limited, Chiyoda-ku (JP)

(72) Inventors: Junichi Kageyama, Chiyoda-ku (JP); Kazuyuki Hayashi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 88 days.

(21) Appl. No.: 14/678,109

(22) Filed: Apr. 3, 2015

(65) Prior Publication Data
US 2015/0301442 A1    Oct. 22, 2015

(30) Foreign Application Priority Data
Apr. 22, 2014  (JP) ................. 2014-088406

(51) Int. Cl.
*G03F 1/24*    (2012.01)
*C23C 14/35*   (2006.01)
*C23C 14/06*   (2006.01)
*C23C 14/58*   (2006.01)
*G03F 1/38*    (2012.01)

(52) U.S. Cl.
CPC ............ *G03F 1/24* (2013.01); *C23C 14/0641* (2013.01); *C23C 14/0676* (2013.01); *C23C 14/35* (2013.01); *C23C 14/5806* (2013.01); *G03F 1/38* (2013.01)

(58) Field of Classification Search
CPC ............ G03F 1/24; C23C 14/35; C23C 14/46
See application file for complete search history.

(56) References Cited

U.S. PATENT DOCUMENTS

| | | |
|---|---|---|
| 2004/0234870 A1 | 11/2004 | Aschke et al. |
| 2009/0253055 A1 | 10/2009 | Hayashi et al. |
| 2013/0323630 A1 | 12/2013 | Maeshige et al. |

FOREIGN PATENT DOCUMENTS

| | | |
|---|---|---|
| JP | 2003-501823 | 1/2003 |
| JP | 2005-210093 | 8/2005 |
| WO | WO 2008/072706 | 6/2008 |

*Primary Examiner* — Stephen Rosasco
(74) *Attorney, Agent, or Firm* — Oblon, McClelland, Maier & Neustadt, L.L.P.

(57) ABSTRACT

A substrate with a conductive film to be used for producing a reflective mask blank for EUV lithography, comprising a substrate and a conductive film formed on the substrate, wherein the conductive film has at least two layers of a lower layer formed on the substrate side and an upper layer formed on the lower layer; the lower layer is a CrN type film which contains Cr and N; the upper layer is a CrON type film which contains Cr, N and O; in the CrN type film, the total content of Cr and N is at least 85 at %, and the compositional atomic ratio of Cr to N is Cr:N=9.5:0.5 to 3:7; in the CrON type film, the total content of Cr, N and O is at least 85 at %, and the compositional atomic ratio of Cr to (N+O) is Cr:(N+O)= 9.5:0.5 to 3:7; and the film thickness of the CrON type film is from 0.5 to 3 nm, and the standard deviation of the film thickness distribution of the CrON type film is at most 0.18 nm.

22 Claims, 1 Drawing Sheet

REFLECTIVE MASK BLANK FOR EUV LITHOGRAPHY, SUBSTRATE WITH FUNTION FILM FOR THE MASK BLANK, AND METHODS FOR THEIR PRODUCTION

TECHNICAL FIELD

The present invention relates to a reflective mask blank for EUV (Extreme Ultra Violet) lithography (in this specification, hereinafter referred to as "EUV mask blank") to be used for e.g. production of semiconductors, and a substrate with a function film to be used for production of the mask blank (in this specification, hereinafter referred to as "substrate with a function film for a mask blank"), and further to methods for their production.

In the present invention, the substrate with a function film for a mask blank means a substrate with a conductive film having a conductive film formed on a substrate, or a substrate with a multilayer reflective film having a multilayer reflective film formed on a substrate.

BACKGROUND ART

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices has been accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF excimer laser (wavelength: 193 nm) is employed, about 45 nm is presumed to be the limit. From this point of view, EUV lithography, which is an exposure technique employing EUV light having a wavelength further shorter than ArF excimer laser, is expected to be prospective as a next generation exposure technique for 45 nm or below. In this specification, EUV light means a light ray having a wavelength within a soft X-ray region or within a vacuum ultraviolet region, specifically a light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional refractive system like photolithography employing visible light or ultraviolet light. For this reason, for EUV lithography, a reflective system, i.e. a reflective photomask and a mirror, is employed.

A mask blank is a stacked structure for production of a photomask, which has not been patterned yet. In the case of a mask blank for a reflective photomask, it has a structure wherein a reflective layer for reflecting EUV light and an absorber layer for absorbing EUV light, are formed in this order on a substrate made of e.g. glass. As the reflective layer, a multilayer reflective film is usually employed, which has high refractive index layers showing a high refractive index to EUV light and low refractive index layers showing a low refractive index to EUV light alternately stacked so as to increase the light reflectivity for light applied to a layer surface, more specifically, the light reflectivity for EUV light applied to a layer surface. For the absorber layer, a material having a high absorption coefficient for EUV light, specifically, for example, a material containing Cr or Ta as the main component is employed.

The multilayer reflective film and the absorber layer are formed on an optical surface of a glass substrate by using a sputtering method such as an ion beam sputtering method or a magnetron sputtering method. At times of forming the multilayer reflective film and the absorber layer, the glass substrate is held by a holding means. Examples for the means of holding a glass substrate include a mechanical chuck and an electrostatic chuck. However, in view of a problem of particle generation, clamping by an electrostatic chuck is preferably employed, as a means of holding the glass substrate when the multilayer reflective film and the absorber layer are formed, particularly as a means of holding the glass substrate when the multilayer reflective film is formed.

Further, in a mask patterning process or mask handling for exposure, clamping by an electrostatic chuck is employed as the means of holding a glass substrate.

The electrostatic chuck is a technique which has heretofore been employed for clamping of a silicon wafer in a process for producing semiconductor devices. Thus, in a case of a substrate such as a glass substrate having a low dielectric constant and a low conductivity, it is necessary to apply a high voltage to obtain a clamping force equivalent to that required for clamping a silicon wafer, and there is a risk of causing a dielectric breakdown.

In order to solve this problem, Patent Document 1 discloses a mask substrate having a back side coating (conductive film) formed of such material as Si, Mo, chromium oxynitride (CrON) or TaSi other than commonly used Cr, which has a higher dielectric constant and a higher conductivity than glass substrate, as a layer for promoting the electrostatic chucking of the substrate.

However, in the mask substrate disclosed in Patent Document 1, since the CrON film has a low adhesion to the glass substrate, there is a problem that peeling occurs between the glass substrate and the CrON film at the time of forming a multilayer reflective film or an absorber layer with the result that particles are generated. Particularly, in the vicinity of the interface between the electrostatic chuck and the CrON film, peeling of the film tends to be caused by a force applied to the vicinity of the interface between the substrate and the electrostatic chuck, which is produced by rotation of the substrate.

Further, since in the mask substrate disclosed in Patent Document 1, a conductive film is formed on the entire region of one surface including chamfers and side faces of the substrate, the adhesive forces of the film to the chamfers and side faces of the substrate are particularly weak since the conductive film is obliquely formed on the chamfers and side faces, and peeling of the film tends to be caused by warpage of the substrate at a time of clamping by an electrostatic chuck or by contact with an end effecter of a robot arm.

If particles are generated e.g. by such peeling of a conductive film at a time of e.g. clamping by an electrostatic chuck, for example, they are likely to inhibit realization of a high quality EUV mask in the step of preparing an EUV mask from the EUV mask blank by forming a mask pattern by irradiation of electron beams, or inhibit realization of transfer in high precision in the step of exposure by the EUV mask. In the case of pattern transfer by using a conventional transmission mask for exposure, since the wavelength of exposure light is relatively long in a UV region (about 157 to 248 nm), even if concave or convex defects are formed on a mask surface, a critical problem is unlikely caused, and accordingly, generation of particles at a time of film-forming has not been recognized as a major problem. However, in a case of using light having a short wavelength such as EUV light as exposure light, even fine concave or convex defects on a mask surface have a major influence on pattern transfer, and accordingly, generation of particles cannot be ignored.

In order to solve the above problems, Patent Document 2 discloses a substrate with a multilayer reflective film, in which generation of particles e.g. due to peeling of a conductive film at a time of clamping the substrate with a conductive film by an electrostatic chuck, is prevented; a high quality reflective mask blank for exposure having few surface defects due to particles; and a high quality reflective mask for exposure having no pattern defect due to particles.

In order to solve the above problems, the substrate with a multilayer reflective film disclosed in Patent Document 2 comprises a conductive film having a composition varying in the thickness direction of the conductive film so that a substrate side of the conductive film contains nitrogen (N) and a surface side of the film contains at least one of oxygen (O) and carbon (C). With respect to the reason why the conductive film has such a structure, Patent Document 2 discloses that nitrogen (N) contained in the substrate side of the conductive film improves the adhesion of the conductive film to the substrate to prevent the conductive film from peeling, and that nitrogen reduces the film stress of the conductive film thereby to increase the attractive force between an electrostatic chuck and the substrate. Further, at least one of oxygen (O) and carbon (C) contained in the surface side of the conductive film increases the surface roughness of the conductive film to an appropriate level, to increase the attractive force between an electrostatic chuck and the substrate at a time of clamping by the electrostatic chuck, to thereby prevent abrasion between the electrostatic chuck and the substrate. Here, oxygen (O) contained in the conductive film roughens the surface roughness (increases the surface roughness) to an appropriate level, and increases the attractive force between the electrostatic chuck and the substrate, and carbon (C) contained in the conductive film decreases the specific resistance of the conductive film to thereby improve the attractive force between the electrostatic chuck and the substrate, according to this document.

In the substrate with a multilayer reflective film disclosed in Patent Document 2, at least one of oxygen (O) and carbon (C) contained in a surface side of the conductive film produces an appropriately roughened state in the surface of the conductive film, to thereby increase the attractive force between an electrostatic chuck and the substrate at the time of clamping by an electrostatic chuck, and to prevent abrasion between the electrostatic chuck and the substrate. However, there is a problem that if abrasion has already occurred, the presence of large surface roughness tends to cause peeling or chipping off of the film to generate particles. Further, when the surface roughness is large, particles (for example, particles from the material of electrostatic chuck or particles of e.g. Mo or Si which is the film material for the film to be formed) on the electrostatic chuck tend to adhere to the conductive film at a time of electrostatic chucking, and since such particles are hard to be cleaned off, there occurs a problem that these particles drop in subsequent steps (e.g. transfer, cleaning or inspection) to cause new defects.

Further, if the substrate side of the conductive film is CrN, since the content of nitrogen (N) is from 40 to 60 at %, the sheet resistance of the conductive film does not become sufficiently low, and it is not possible to sufficiently increase the clamping force by the electrostatic chuck. As a result, it is not possible to sufficiently increase the contact between the electrostatic chuck and the substrate with a conductive film.

In order to solve the above problems of the substrate with a multilayer reflective film disclosed in Patent Document 2, the present applicant has proposed in Patent Document 3 a substrate with a conductive film for an EUV mask blank, characterized in that the conductive film contains chromium (Cr) and nitrogen (N), the average concentration of N in the conductive film is at least 0.1 at % and less than 40 at %, the crystal state of at least a surface of the conductive film is amorphous, the sheet resistance of the conductive film is at most 27 Ω/□, and the surface roughness (rms) of the conductive film is at most 0.5 nm. Further, the present applicant proposes an EUV mask blank to be prepared by using the substrate with a conductive film, a substrate with a multilayer reflective film for the mask blank, and a reflective mask prepared by using the mask blank.

In the substrate with a conductive film disclosed in Patent Document 3, the surface roughness of a surface of the conductive film is small, which improves the contact with an electrostatic chuck. Further, the sheet resistance of the conductive film is low, which improves the clamping force by the electrostatic chuck. As a result, when the substrate with a conductive film is fixed to an electrostatic chuck and used for producing an EUV mask blank, its contact with the electrostatic chuck is improved. When the contact with the electrostatic chuck is improved, generation of particles by abrasion between the electrostatic chuck and the substrate is prevented.

PRIOR ART DOCUMENTS

Patent Documents

Patent Document 1: JP-A-2003-501823
Patent Document 2: JP-A-2005-210093
Patent Document 3: JP-A1-2008-072706

DISCLOSURE OF INVENTION

Technical Problem

In the substrate with a conductive film disclosed in Patent Document 3, the surface roughness of the conductive film surface is small, whereby the contact with an electrostatic chuck is said to be improved. However, while there is an increasing demand to eliminate the defect density caused by particles, in order to further improve the contact with the electrostatic chuck, it has now been required to minimize the surface roughness of the conductive film.

The conductive film disclosed in Patent Document 3 contains chromium (Cr) and nitrogen (N), and at the surface of the conductive film having such a composition, a natural oxide film will inevitably be formed. With such a naturally formed surface oxide film (natural oxide film), the film thickness tends to fluctuate, since the forming conditions cannot be controlled. Such fluctuations in the thickness of the surface oxide film have been found to cause to increase the surface roughness (rms) of the conductive film and thus are likely to inhibit improvement in the contact with the electrostatic chuck.

In order to solve the above problems of prior art, it is an object of the present invention is to provide a substrate with a conductive film for an EUV mask blank, which has a conductive film having a low sheet resistance and excellent surface smoothness, and a method for its production.

Further, it is another object of the present invention to provide a substrate with a multilayer reflective film for an EUV mask blank, and an EUV mask blank, by using the substrate with a conductive film.

Solution to Problem

In order to accomplish the above objects, the present invention provides a substrate with a conductive film to be used for producing a reflective mask blank for EUV lithography, comprising a substrate and a conductive film formed on the substrate;

wherein the conductive film has at least two layers of a layer (lower layer) formed over the substrate side and a layer (upper layer) formed on the lower layer;

the lower layer of the conductive film is a CrN type film which contains chromium (Cr) and nitrogen (N);

the upper layer of the conductive film is a CrON type film which contains Cr, N and oxygen (O);

in the CrN type film, the total content of Cr and N is at least 85 at %, and the compositional ratio (atomic ratio) of Cr to N is Cr:N=9.5:0.5 to 3:7;

in the CrON type film, the total content of Cr, N and O is at least 85 at %, and the compositional ratio (atomic ratio) of Cr to (N+O) is Cr:(N+O)=9.5:0.5 to 3:7; and the film thickness of the CrON type film is from 0.5 to 3 nm, and the standard deviation of the film thickness distribution of the CrON type film is at most 0.18 nm.

In the substrate with a conductive film of the present invention, the conductive film may further have a second lower layer between the above lower layer and the substrate; the second lower layer is a CrO type film which contains Cr and O; and in the CrO type film, the total content of Cr and O is at least 85 at %, and the compositional ratio (atomic ratio) of Cr to O is Cr:O=9:1 to 3:7.

In the substrate with a conductive film of the present invention, each layer constituting the conductive film may further contain at least one element selected from the group consisting of H, B, Al, Ag, Co, Cu, Fe, Hf, In, Mo, Ni, Nb, Si, Ta, Ti, Zn and Zr in a total content of at most 15 at %.

In the substrate with a conductive film of the present invention, the film thickness of the lower layer is preferably from 50 to 500 nm.

In the substrate with a conductive film of the present invention, the film thickness of the second lower layer is preferably from 1 to 30 nm.

In the substrate with a conductive film of the present invention, the sheet resistance of the conductive film is preferably at most 20 Ω/□.

In the substrate with a conductive film of the present invention, the lower layer of the conductive film is preferably in an amorphous state.

In the substrate with a conductive film of the present invention, the upper layer of the conductive film is preferably in an amorphous state.

In the substrate with a conductive film of the present invention, the second lower layer of the conductive film is preferably in an amorphous state.

In the substrate with a conductive film of the present invention, the surface roughness (rms) of (the upper layer of) the conductive film is preferably at most 0.5 nm.

Further, the present invention provides a substrate with a multilayer reflective film for a reflective mask blank for EUV lithography (in this specification, hereinafter referred to as "substrate with a multilayer reflective film of the present invention), comprising the substrate with a conductive film of the present invention, and a multilayer reflective film formed on a surface of the substrate opposite to the surface on which the conductive film is formed.

Further, the present invention provides a reflective mask blank for EUV lithography (in this specification, hereinafter referred to as "EUV mask blank of the present invention"), comprising the substrate with a multilayer reflective film of the present invention, and an absorber layer formed on the multilayer reflective film.

Further, the present invention provides a reflective mask for EUV lithography (in this specification, hereinafter referred to as "EUV mask of the present invention") produced by patterning the EUV mask blank of the present invention.

Further, the present invention provides a method for producing a substrate with a conductive film, which comprises forming a CrN type film containing chromium (Cr) and nitrogen (N) on a substrate by means of a sputtering method, and then, heat-treating the CrN type film at a temperature of from 110 to 170° C.

Further, the present invention provides a method for producing a substrate with a conductive film, which comprises forming a CrO type film containing chromium (Cr) and oxygen (O) on a substrate and forming a CrN type film containing chromium (Cr) and nitrogen (N) on the CrO type film, by means of a sputtering method, and then, heat-treating the CrN type film at a temperature of from 110 to 170° C.

Further, the present invention provides a method for producing a substrate with a multilayer reflective film to be used for producing a reflective mask blank for EUV lithography, which comprises forming a CrN type film containing chromium (Cr) and nitrogen (N) on a substrate and forming a multilayer reflective film to reflect EUV light on a substrate surface opposite to the surface on which the CrN type film is formed, by means of a sputtering method, and then, heat-treating the CrN type film at a temperature of from 110 to 170° C.

Further, the present invention provides a method for producing a substrate with a multilayer reflective film to be used for producing a reflective mask blank for EUV lithography, which comprises forming a CrO type film containing chromium (Cr) and oxygen (O) on a substrate, forming a CrN type film containing chromium (Cr) and nitrogen (N) on the CrO type film, and forming a multilayer reflective film to reflect EUV light on a substrate surface opposite to the surface on which the CrN type film is formed, by means of a sputtering method, and then, heat-treating the CrN type film at a temperature of from 110 to 170° C.

In the method for producing a substrate with a multilayer reflective film of the present invention, a protective layer may be formed on the multilayer reflective film. Here, after the protective layer is formed, the CrN type film may be heat-treated at a temperature of from 110 to 170° C.

Further, the present invention provides a method for producing a reflective mask blank for EUV lithography, which comprises forming a CrN type film containing chromium (Cr) and nitrogen (N) on a substrate, forming a multilayer reflective film to reflect EUV light on a substrate surface opposite to the surface on which the CrN type film is formed and forming an absorber layer to absorb EUV light on the multilayer reflective film, by means of a sputtering method, and then, heat-treating the CrN type film at a temperature of from 110 to 170° C.

Further, the present invention provides a method for producing a reflective mask blank for EUV lithography, which comprises forming a CrO type film containing chromium (Cr) and oxygen (O) on a substrate, forming a CrN type film containing chromium (Cr) and nitrogen (N) on the CrO type film, forming a multilayer reflective film to reflect EUV light on a substrate surface opposite to the surface on which the CrN type film is formed and forming an absorber layer to absorb EUV light on the multilayer reflective film, by means of a sputtering method, and then, heat-treating the CrN type film at a temperature of from 110 to 170° C.

In the method for producing a reflective mask blank for EUV lithography of the present invention, a protective layer may be formed on the multilayer reflective film, and an absorber layer may be formed on the protective layer.

Advantageous Effects of Invention

In the substrate with a conductive film of the present invention, the fluctuations in the film thickness on the conductive film surface side are reduced so that the surface roughness at the conductive film surface is reduced, which improves the contact with an electrostatic chuck. Further, the sheet resistance of the conductive film is low, which improves the clamping force by an electrostatic chuck. As a result, when the substrate with a conductive film is fixed to an electrostatic chuck and used for producing an EUV mask blank, its contact with the electrostatic chuck is improved. When the contact with the electrostatic chuck is improved, generation of particles due to abrasion between the electrostatic chuck and the substrate is prevented.

DESCRIPTION OF EMBODIMENTS

Figure 1:
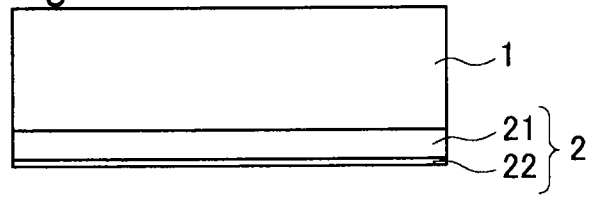
FIG. 1 is a schematic view illustrating a substrate with a conductive film of the present invention.

Now, the present invention will be described with reference to the drawings. FIG. 1 is a schematic view illustrating a substrate with a conductive film of the present invention. In FIG. 1, the substrate 1 for film deposition has a surface on which a conductive film 2 is formed. At the time of forming a multilayer reflective film and an absorber layer on the substrate 1, the substrate 1 will be fixed to an electrostatic chuck via the conductive film 2. As disclosed later, the multilayer reflective film and the absorber layer will be formed on an opposite side (film deposition surface) of the substrate 1 to the surface on which the conductive film 2 is formed. In short, the conductive film 2 is a back side conductive film formed on a back side of the substrate 1 to the film deposition surface.

As shown in FIG. 1, the conductive film 2 has a two-layer structure of a lower layer 21 formed on the substrate 1 side and an upper layer 22 formed on the lower layer 21.

In the conductive film 2 having such a two-layer structure, the lower layer 21 has a function to lower the resistance of the entire conductive film 2. On the other hand, the upper layer 22 is a layer containing a natural oxide film to be inevitably formed as mentioned above, but has a function to improve the contact between the clamping surface of an electrostatic chuck and the conductive film 2, by reducing in-plane fluctuations in the natural oxide film thickness so as to reduce the surface roughness of the conductive film 2 surface. By such a structure, while the sheet resistance of the conductive film 2 is made low, contact between the conductive film and the clamping surface of the electrostatic chuck can be improved, whereby generation of particles due to abrasion between the electrostatic chuck and the substrate can be prevented.

In order to achieve the above function, the lower layer 21 of the conductive film 2 is required to have higher dielectric constant and conductivity than the material of the substrate 1.

Further, in order to improve smoothness of the lower layer 21 surface, the lower layer is preferably in an amorphous state. When the smoothness of the lower layer 21 surface is improved, the smoothness of the surface of the upper layer 22 formed on the lower layer 21 will also be improved, whereby improvement in the smoothness of the conductive film 2 surface is expected.

In this specification, "in an amorphous state" means not only a state of amorphous structure having no crystal structure at all but also a state of a microcrystal structure.

Whether the lower layer 21 is in an amorphous state, i.e. in a state of amorphous structure or microcrystal structure, may be confirmed by an X-ray diffraction (XRD) method. When the lower layer 21 has an amorphous structure or a microcrystal structure, no sharp peak will be observed among the diffraction peaks obtained by the XRD measurement.

In order to satisfy the above, the lower layer 21 is a CrN type film which contains chromium (Cr) and nitrogen (N). Here, in the CrN type film, the total content of Cr and N is at least 85 at %, and the compositional ratio of Cr to N is Cr:N=9.5:0.5 to 3:7.

In the CrN type film, if the total content of Cr and N is less than 85 at %, the CrN type film tends to be hardly amorphous, whereby the smoothness of the CrN type film surface tends to deteriorate, and the surface roughness is likely to increase. The total content of Cr and N is preferably at least 87%, more preferably at least 90%.

In the CrN type film, if Cr is larger than the above compositional ratio, the hardness tends to be low, and the film is likely to be damaged to generate dust at the time of clamping by an electrostatic chuck. On the other hand, if N is larger than the above compositional ratio, the hardness tends to be high, and the electrostatic chuck is likely to be damaged at the time of clamping by the electrostatic chuck, which may also cause dust generation.

The compositional ratio of Cr to N is preferably from 9.5:0.5 to 6:4, more preferably from 9.5:0.5 to 6.5:3.5, further preferably from 9.5:0.5 to 7:3.

In the present invention, the CrN type film may further contain at least one element selected from the group consisting of hydrogen (H), boron (B), aluminum (Al), silver (Ag), cobalt (Co), copper (Cu), iron (Fe), hafnium (Hf), indium (In), molybdenum (Mo), nickel (Ni), niobium (Nb), silicon (Si), tantalum (Ta), titanium (Ti), zinc (Zn) and zirconium (Zr) in a total content of at most 15 at %. When these elements are contained in a total amount of at most 15 at %, they contribute to make the CrN type film to be amorphous and thereby to make the CrN film surface to be smooth. In order to obtain such an effect, the total content of these elements is preferably from 0.1 to 15 at %, more preferably from 0.1 to 13 at %, further preferably from 0.1 to 10 at %, particularly preferably from 0.1 to 8 at %.

Here, among the above elements, H is preferred in order to obtain the above effect.

The lower layer 21 is a CrN type film with the above-described constitution, whereby it becomes amorphous, and its surface is excellent in smoothness.

With respect to the smoothness, the surface roughness (rms) of the lower layer 21 is preferably at most 0.5 nm. When the surface roughness (rms) of the lower layer 21 is at most 0.5 nm, the surface of the lower layer 21 is sufficiently smooth, and accordingly the surface roughness (rms) of the upper layer 22 formed on the lower layer 21 is also expected to be at most 0.5 nm. Especially, as mentioned later, the upper layer 22 is a thin film with its film thickness being from 0.5 to 3 nm, and accordingly, the surface roughness of the upper layer 22 i.e. the surface roughness of the conductive film 2, is susceptible to an influence of the surface roughness of the lower layer 21. Here, the surface roughness of the lower layer 21 can be measured by using an atomic force microscope.

The surface roughness (rms) of the lower layer 21 is more preferably at most 0.4 nm, further preferably at most 0.3 nm.

Further, the film thickness of the lower layer 21 is preferably from 50 to 500 nm. If the film thickness of the lower layer 21 which has a function to lower the resistance of the entire conductive film 2, is less than 50 nm, it may not be able to lower the sheet resistance of the conductive film 2. On the other hand, if the film thickness of the lower layer 21 exceeds 500 nm, an increase of the film thickness no longer contributes to improvement of the function of the lower layer 21, and the time required for the formation of the lower layer 21 increases, thus leading to an increase of costs required for the formation of the lower layer 21 and eventually of the conductive film 2. Further, the film thickness of the lower layer 21 and eventually of the conductive film 2 becomes more than necessary, whereby possibility of peeling of the film increases.

The film thickness of the lower layer 21 is more preferably from 70 to 450 nm, further preferably from 160 to 400 nm.

In order to achieve the above function, the upper layer 22 constituting the surface of the conductive film 2 is preferably in an amorphous state to improve the smoothness of the conductive film 2 surface. Here, the conductive film 2 surface is required to be excellent in smoothness in order to improve the contact between the clamping surface of the electrostatic chuck and the conductive film 2. By the improvement of the contact between the clamping surface of the electrostatic chuck and the conductive film 2, it is possible to prevent generation of particles due to abrasion between the electrostatic chuck and the conductive film 2 when the substrate with the conductive film is clamped by the electrostatic chuck.

Further, the upper layer 22 constituting a part of the conductive film 2 preferably has higher dielectric constant and conductivity than the material of the substrate 1.

In order to satisfy the above, the upper layer 22 is a CrON type film which contains Cr, N and oxygen (O). Here, in the CrON type film, the total content of Cr, O and N is at least 85 at %, and the compositional ratio of Cr to (O+N) is Cr:(O+N)=9.5:0.5 to 3:7.

In the CrON type film, if the total content of Cr, N and O is less than 85 at %, the CrON type film tends to be hardly amorphous, whereby the smoothness of the CrON type film surface tends to deteriorate, and the surface roughness is likely to increase. The total content of Cr, N and O is preferably at least 87%, more preferably at least 90%.

In the CrON type film, if Cr is larger than the above compositional ratio, the hardness tends to be low, and the film is likely to be damaged to generate dust at the time of clamping by an electrostatic chuck. On the other hand, if O+N is larger than the above compositional ratio, defects are likely to increase during the film deposition, whereby at the time of clamping by the electrostatic chuck in exposure, the substrate is likely to have deformation, and transfer of a pattern is likely to get distorted. The compositional ratio of Cr to O+N is preferably from 9.5:0.5 to 6:4, more preferably from 9.5:0.5 to 6.5:3.5, further preferably from 9.5:0.5 to 7:3.

In the CrON type film, the compositional ratio of O to N is preferably O:N=1:10 to 10:1. If O is larger than the above compositional ratio, the hardness tends to be low, and the film is likely to be damaged to generate dust at the time of clamping by an electrostatic chuck. On the other hand, if N is larger than the above compositional ratio, defects are likely to increase during the film deposition, whereby at the time of clamping by the electrostatic chuck in exposure, the substrate is likely to have deformation, and transfer of a pattern is likely to get distorted. The compositional ratio of O to N is preferably from 1:9 to 9:1, more preferably from 1:8 to 8:1, further preferably from 1:7 to 7:1.

In the present invention, the CrON type film may further contain at least one element selected from the group consisting of H, B, Al, Ag, Co, Cu, Fe, Hf, In, Mo, Ni, Nb, Si, Ta, Ti, Zn and Zr in a total content of at most 15 at %. When these elements are contained in a total amount of at most 15 at %, they contribute to make the CrON type film to be amorphous and thereby to make the CrON film surface to be smooth. In order to obtain such an effect, the total content of these elements is preferably from 0.1 to 15 at %, more preferably from 0.1 to 13 at %, further preferably from 0.1 to 10 at %, particularly preferably from 0.1 to 8 at %.

Here, among the above elements, H is preferred in order to obtain the above effect.

The upper layer 22 is a CrON type film with the above-described constitution, whereby it becomes amorphous, and its surface is excellent in smoothness.

With respect to the smoothness, the surface roughness (rms) of the upper layer 22 is preferably at most 0.5 nm. When the surface roughness (rms) of the upper layer 22 constituting the surface of the conductive film 2 is at most 0.5 nm, the contact with the electrostatic chuck is improved, whereby generation of particles due to abrasion between the electrostatic chuck and the conductive film 2 is prevented. The surface roughness of the upper layer 22 can be measured by using an atomic force microscope.

The surface roughness (rms) of the upper layer 22 is more preferably at most 0.4 nm, further preferably at most 0.3 nm.

Here, the surface roughness (rms) in the present invention is meant for root-mean-square roughness Rq (old RMS) in accordance with JIS-B0601.

The film thickness of the CrON type film is preferably from 0.5 to 3 nm. If the film thickness of the CrON type film is less than 0.5 nm, there will be a problem such that uniform film deposition tends to be difficult. On the other hand, if the film thickness of the CrON type film exceeds 3 nm, such is not a level of a natural oxide film, but is a level of film thickness to be realized by an intentional film deposition method using e.g. a sputtering method, and control of the surface roughness tends to be difficult.

Further, the lower limit for the film thickness of the CrON type film is preferably 0.7 nm, more preferably 0.9 nm, further preferably 1.1 nm. Further, the upper limit for the film thickness of the CrON type film is preferably 2.8 nm, more preferably 2.6 nm, further preferably 2.4 nm.

Here, the film thickness in the present invention can be determined e.g. by a value based on the result of measurement by an X-ray reflectance analysis (Smartlab HTP, manufactured by Rigaku Corporation).

The CrON type film in the present invention has a feature that fluctuations in the film thickness are small, in addition to the film thickness being within the above range. In the present invention, a standard deviation of the film thickness distribution is used as an index for fluctuations in the film thickness. The CrON type film of the present invention has a standard deviation of the film thickness distribution being at most 0.18 nm, whereby the surface roughness is small at the surface of the CrON type film constituting the conductive film surface, and the contact with the electrostatic chuck is improved. That is, while the surface (on the upper layer 22 side) of the CrN type film as the lower layer 21 has a prescribed surface roughness, if the CrON type film as the upper layer 22 formed on the CrN type film as the lower layer 21, has large fluctuations in its film thickness, the surface roughness of the CrON type film will have a larger value than the surface roughness of the CrN type film. Accordingly, by reducing fluctuations in the film thickness of the CrON type film, it is possible to suppress an increase in the surface roughness of the CrON type film to be added to the surface roughness of the CrN type film i.e. to suppress an increase in the surface roughness of the conductive film 2, and as a result, it is possible to improve the contact with the clamping surface of the electrostatic chuck.

The standard deviation of the film thickness distribution of the CrON type film may be obtained by measuring the film thickness distribution, particularly the film thickness distribution from the center towards the periphery of the surface of the CrON type film, by means of e.g. an X-ray reflectance analyzer.

The standard deviation of the film thickness distribution of the CrON type film is preferably at most 0.18 nm, more preferably at most 0.15 nm, further preferably at most 0.1 nm.

The CrON type film in the present invention has a surface roughness being small at the surface of the CrON type film, whereby the contact with the electrostatic chuck is improved. Namely, as mentioned above, the CrON type film corresponding to the upper layer 22 is a thin film, and therefore, the level of the surface roughness is almost determined by the surface roughness of the CrN type film corresponding to the lower layer 21, however, by controlling the standard deviation of the film thickness of the upper layer 22 to be at most 0.18 nm, it is possible to suppress the surface roughness to be added to the upper layer 22 from the surface roughness of the lower layer 21, i.e. to suppress an increase in the surface roughness of the conductive film 2. Thus, in the present invention, by using the standard deviation of the film thickness distribution of the CrON type film corresponding to the upper layer 22, as an index for the surface roughness, the control level of the surface roughness is evaluated from the uniformity level of the film thickness of only the upper layer 22.

Further, the conductive film 2 in the present invention may have a second lower layer formed between the CrN type film constituting the lower layer 21 and the substrate 1. In such a case, the second lower layer has a function as an adhesion-improving layer to improve the adhesion between the substrate 1 and the conductive film 2. By adopting such a constitution, it is possible to prevent formation of defects by preventing peeling of the conductive film from the substrate, while reducing the sheet resistance of the conductive film 2.

In order to achieve the above function, the second lower layer is required to be excellent in the adhesion to the substrate 1.

Further, the second lower layer constituting a part of the conductive film 2 is required to have higher dielectric constant and conductivity than the material of the substrate 1.

Furthermore, the second lower layer is preferably in an amorphous state to improve the smoothness of the surface of the second layer. By the improvement of the smoothness of the surface of the second layer, it is expected that the smoothness of the surface is improved also with respect to the lower layer 21 to be formed on the second lower layer and further with respect to the upper layer 22 to be formed on the lower layer 21, and consequently, the smoothness of the conductive film 2 surface is improved.

In order to satisfy the above, the second lower layer is a CrO type film which contains Cr and O. In the CrO type film, the total content of Cr and O is at least 85 at %, and the compositional ratio (atomic ratio) of Cr to O is Cr:O=9:1 to 3:7.

In the CrO type film, if the total content of Cr and O is less than 85 at %, the CrO type film tends to be hardly amorphous, whereby the smoothness of the CrO type film surface tends to deteriorate, and the surface roughness is likely to increase. The total content of Cr and O is preferably at least 87%, more preferably at least 90%, further preferably at least 92 at %.

In the CrO type film, if Cr is larger than the above compositional ratio, there is a problem such that the adhesion strength to the substrate tends to deteriorate. On the other hand, if O is larger than the above compositional ratio, defects are likely to increase.

The compositional ratio of Cr to O is preferably from 9:1 to 2.5:7.5, more preferably from 8.5:1.5 to 2.5:7.5, further preferably from 8:2 to 2.5:7.5.

In the present invention, the CrO type film may further contain at least one element selected from the group consisting of H, B, Al, Ag, Co, Cu, Fe, Hf, In, Mo, Ni, Nb, Si, Ta, Ti, Zn and Zr in a total content of at most 15 at %. When these elements are contained in a total amount of at most 15 at %, they contribute to make the CrO type film to be amorphous and thereby to make the CrO film surface to be smooth. In order to obtain such an effect, the total content of these elements is preferably from 0.1 to 15 at %, more preferably from 0.1 to 13 at %, further preferably from 0.1 to 10 at %, particularly preferably from 0.1 to 8 at %.

Here, among the above elements, H is preferred in order to obtain the above effect.

The second lower layer is a CrO type film with the above-described constitution, whereby it becomes amorphous, and its surface is excellent in smoothness.

With respect to the smoothness, the surface roughness (rms) of the second lower layer is preferably at most 0.5 nm. When the surface roughness (rms) of the second lower layer is at most 0.5 nm, the second lower layer surface is sufficiently smooth, whereby it is expected that the surface roughness (rms) of the lower layer 21 to be formed on the second lower layer will also be at most 0.5 nm. The surface roughness of the second lower layer can be measured by using an atomic force microscope.

The surface roughness (rms) of the second lower layer is more preferably at most 0.4 nm, further preferably at most 0.3 nm.

The film thickness of the second lower layer is preferably from 1 to 30 nm. If the film thickness of the second lower layer is less than 1 nm, the adhesion strength of the second lower layer to the substrate tends to be low, film peeling is likely to occur at the conductive film 2. On the other hand, if the film thickness of the second lower layer exceeds 30 nm, the sheet resistance of the conductive film 2 is likely to be high. Further, the lower layer 21 to be formed on the second lower layer is likely to be not in an amorphous state.

The film thickness of the second lower layer is more preferably from 2 to 28 nm, further preferably from 3 to 20 nm.

The CrN type film as the lower layer 21 may be formed by a known method, e.g. a sputtering method such as a magnetron sputtering method or an ion beam sputtering method. In the case of forming a CrN type film by a sputtering method, a sputtering method using a Cr target may be carried out in an atmosphere containing nitrogen (N) and an inert gas containing at least one among helium (He), argon (Ar), neon (Ne), krypton (Kr) and xenon (Xe). In the case of using a magnetron sputtering method, specifically, it may be carried out under the following conditions.

Film Deposition Conditions for CrN Type Film

Sputtering gas: a mixed gas of Ar and $N_2$ ($N_2$ gas concentration: from 1 to 80 vol %, preferably from 5 to 75 vol %, Ar gas concentration: from 20 to 99 vol %, preferably from 25 to 95 vol %, gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Input power: from 30 to 6,000 W, preferably from 100 to 6,000 W, more preferably from 500 to 6,000 W Film deposition rate: from 0.5 to 120 nm/min., preferably from 1.0 to 45 nm/min., more preferably from 1.5 to 30 nm/min.

Further, in the case of forming a second lower layer between the CrN film constituting the lower layer 21 and the substrate 1, the CrO type film constituting the second lower layer may be formed by a known method, e.g. a sputtering method such as a magnetron sputtering method or an ion beam sputtering method. In the case of forming a CrO type film by a sputtering method, a sputtering method using a Cr target may be carried out in an atmosphere containing oxygen (O) and an inert gas containing at least one among helium (He), argon (Ar), neon (Ne), krypton (Kr) and xenon (Xe). In the case of using a magnetron sputtering method, specifically, it may be carried out under the following conditions.

Film Deposition Conditions for CrO Type Film

Sputtering gas: a mixed gas of Ar and $O_2$ ($O_2$ gas concentration: from 1 to 80 vol %, preferably from 5 to 75 vol %, Ar gas concentration: from 20 to 99 vol %, preferably from 25 to 95 vol %, gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Input power: from 30 to 6,000 W, preferably from 100 to 6,000 W, more preferably from 500 to 6,000 W Film deposition rate: from 0.5 to 120 nm/min., preferably from 1.0 to 45 nm/min., more preferably from 1.5 to 30 nm/min.

Here, in either case of at the time of forming the CrN type film and at the time of forming the CrO type film, in a case where an inert gas other than Ar is to be used, the concentration of such an inert gas is adjusted to be within the same concentration range as the above-mentioned Ar gas concentration. Further, in a case where a plurality of inert gases are to be used, the total concentration of such inert gases is adjusted to be within the same concentration range as the above-mentioned Ar gas concentration.

Further, the atmosphere temperature during sputtering is preferably from 60 to 150° C., since it is thereby possible to prevent peeling of deposition of film deposition material deposited on the inner wall of the deposition apparatus and to reduce defects in the conductive film 2 thereby formed.

In the present invention, the CrON type film constituting the upper layer 22 may be formed by forming the CrN type film constituting the lower layer 21 and then heat-treating the CrN type film at a temperature of from 110 to 170° C. By this heat treatment, the surface of the CrN type film is oxidized to form a CrON type film having small fluctuations in the film thickness, specifically a CrON type film having a standard deviation of the film thickness distribution being at most 0.18 nm.

Here, even by natural oxidation of the CrN type film surface, a CrON type film may be formed, however, the CrON type film formed by such natural oxidation has large fluctuations in the film thickness, and it is not possible to form a CrON type film having a standard deviation of the film thickness distribution being at most 0.18 nm.

If the heat treatment temperature is lower than 110° C., a CrON type film to be formed tends to have large fluctuations in the film thickness, and it is not possible to form a CrON type film having a standard deviation of the film thickness distribution being at most 0.18 nm.

On the other hand if the heat treatment temperature is higher than 170° C., oxidation of the CrN type film tends to proceed excessively, whereby the sheet resistance of the conductive film 2 tends to be high.

The temperature for the heat treatment is more preferably from 115° C. to 160° C., further preferably from 120° C. to 150° C.

Further, the heating time is preferably within a range of from 15 to 40 minutes, more preferably within a range of from 18 to 30 minutes. If the time for the heat treatment is shorter than 15 minutes, fluctuations in the film thickness of the CrON type film to be formed tend to be large, whereby it may not be possible to form a CrON type film having a standard deviation of the film thickness distribution being at most 0.18 nm. On the other hand, if the time for the heat treatment is longer than 40 minutes, oxidation of the CrN type film tends to proceed excessively, whereby the sheet resistance of the conductive film 2 tends to be high.

In the present invention, the heat treatment of the CrN type film is intended for surface oxidation of the CrN type film and thus can be carried out in the atmospheric air.

Further, the conductive film 2 preferably has a sheet resistance of at most 20 $\Omega/\square$. When the sheet resistance of the conductive film 2 is at most 20 $\Omega/\square$, the clamping force by the electrostatic chuck will be increased, whereby the contact with the electrostatic chuck will be improved. As a result, generation of particles due to abrasion between the electrostatic chuck and the conductive film 2 will be prevented.

The sheet resistance of the conductive film 2 is more preferably at most 15 $\Omega/\square$, further preferably at most 10 $\Omega/\square$.

As mentioned with respect to the CrON type film constituting the upper layer 22, with respect to the surface roughness (rms) of the conductive film 2, its level is almost determined by the surface roughness of the CrN type film corresponding to the lower layer 21, however, it is preferably at most 0.5 nm, whereby the contact with the electrostatic chuck is improved, and formation of particles by abrasion between the electrostatic chuck and the conductive film 2 is prevented. Further, the surface roughness (rms) of the conductive film 2 is more preferably at most 0.4 nm, further preferably at most 0.3 nm.

In the substrate with a conductive film of the present invention, the substrate 1 for film deposition is required to satisfy the characteristics as a substrate for an EUV mask blank. Accordingly, the substrate 1 is preferably one having a low thermal expansion coefficient (specifically, the thermal expansion coefficient at 20° C. is preferably $0\pm0.05\times10^{-7}/°$ C., particularly preferably $0\pm0.03\times10^{7}/°$ C.) and being excellent in smoothness, flatness and resistance to a cleaning liquid to be used for cleaning the mask blank or the photomask after patterning.

As the substrate 1, specifically, glass having a low thermal expansion coefficient such as $SiO_2$—$TiO_2$ glass may be used. However, it is not limited to such glass, and a substrate of crystallized glass having a β quartz solid solution precipitated, quartz glass, silicon, a metal or the like may be employed.

The substrate 1 preferably has a smooth surface having a surface roughness (rms) of at most 0.15 nm and a flatness of at most 100 nm, because it is possible to obtain a high reflectivity and a high transfer accuracy in a photomask after patterning.

The size, thickness, etc. of the substrate 1 may be appropriately determined depending on the design values of the mask. In Examples described later, $SiO_2$—$TiO_2$ glass having external dimensions of about 6 inches (152 mm) square and a thickness of about 0.25 inch (6.3 mm) was used.

Figure 2:
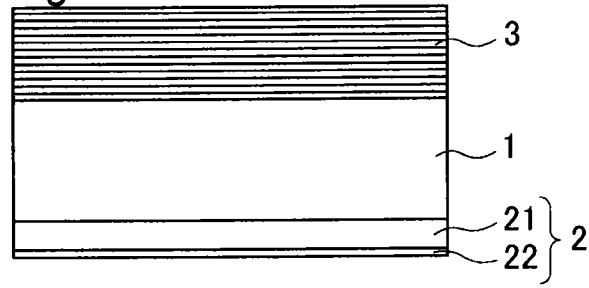
FIG. 2 is a schematic view illustrating a substrate with a multilayer reflective film of the present invention.

Now, the substrate with a multilayer reflective film of the present invention will be described. FIG. 2 is a schematic view illustrating a substrate with a multilayer reflective film of the present invention. As shown in FIG. 2, a multilayer reflective film 3 is formed on a surface of a substrate 1 opposite to a surface on which a conductive film 2 is formed. Here, the substrate 1 and the conductive film 2 are ones shown in FIG. 1 (the substrate with a conductive film of the present invention). The substrate with a multilayer reflective film of the present invention can be obtained by fixing the substrate with a conductive film of the present invention onto an electrostatic chuck, and forming a multilayer reflective film 3 on a film deposition surface of the substrate 1 by using a sputtering method such as a magnetron sputtering method or an ion beam sputtering method.

The multilayer reflective film 3 to be formed on the substrate 1 is not particularly limited so long as it has desired characteristics as a reflective layer of an EUV mask blank. Here, the characteristic particularly required for the multilayer reflective film 3 is a high EUV light reflectivity. Specifically, when the surface of the multilayer reflective film 3 is irradiated with light at a wavelength region of EUV light at an incident angle of 6 degrees, the maximum value of the light reflectivity at a wavelength in the vicinity of 13.5 nm is preferably at least 60%, more preferably at least 63%, further preferably at least 65%.

The multilayer reflective film 3 satisfying the above characteristics may, for example, be a Si/Mo multilayer reflective film comprising Si films and Mo films alternately stacked, a Be/Mo multilayer reflective film comprising Be films and Mo films alternately stacked, a Si compound/Mo compound multilayer reflective film comprising Si compound films and Mo compound films alternately stacked, a Si/Mo/Ru multilayer reflective film comprising Si films, Mo films and Ru films repeatedly stacked in this order, or a Si/Ru/Mo/Ru multilayer reflective film comprising Si films, Ru films, Mo films and Ru films repeatedly stacked in this order.

Further, the substrate with a multilayer reflective film includes one having a protective layer (not shown) formed on the multilayer reflective layer 3 to protect the multilayer reflective layer 3 at the time of forming a pattern in the absorber layer 4 of an EUV mask blank. And, even when the substrate has such a protective layer on the multilayer reflective film, the maximum value of the light reflectivity at a wavelength in the vicinity of 13.5 nm is preferably at least 60%, more preferably at least 63%, further preferably at least 65%.

The protective layer is provided for the purpose of protecting the multilayer reflective film 3 so that the multilayer reflective layer 3 would not be damaged by an etching process, at the time of forming a pattern in an absorber layer by the etching process, usually by a dry etching process. Therefore, as the material for the protective layer, a material is selected so that it is less susceptible to an influence by an etching process of the multilayer reflective film 3 i.e. it has an etching rate slower than the absorber layer and is less susceptible to damage by such an etching process. The protective layer is preferably made of Ru or a Ru compound (such as RuB, RuSi or RuNb) as the constituent material.

The protective layer may be formed by means of a well-known film deposition method such as a magnetron sputtering method or an ion beam sputtering method. In the case of forming a Ru film by a magnetron sputtering method, it is preferred to conduct the film deposition by using a Ru target as the target and using Ar gas (gas pressure: from $1.0\times10^{-2}$ Pa to $10\times10^{-1}$ Pa) at an input voltage of from 30V to 1,500V at a film deposition rate of from 0.02 to 1.0 nm/sec. so that the thickness would be from 2 to 5 nm.

The procedure for forming the multilayer reflective film 3 on the film deposition surface of the substrate 1 may be a commonly used procedure for forming a multilayer reflective film using a sputtering method. For example, in a case of forming a Si/Mo multilayer reflective film by using an ion beam sputtering method, it is preferred that a Si film is deposited by using a Si target as a target and Ar gas (gas pressure: from $1.3\times10^{-2}$ Pa to $2.7\times10^{-2}$ Pa) as a sputtering gas under an ion acceleration voltage of from 300 to 1,500 V at a film-deposition rate of from 0.03 to 0.30 nm/sec so as to have a thickness of 4.5 nm, and subsequently a Mo film is deposited by using a Mo target as a target and Ar gas (gas pressure: from $1.3\times10^{-2}$ Pa to $2.7\times10^{-2}$ Pa) as a sputtering gas under an ion acceleration voltage of from 300 to 1,500 V at a film-deposition rate of from 0.03 to 0.30 nm/sec so as to have a thickness of 2.3 nm. Taking the above process as one cycle, from 40 to 50 cycles of deposition of a Si film and a Mo film are carried out to form a Si/Mo multilayer reflective film. When the multilayer reflective film 3 is to be formed, in order to obtain a uniform film thickness, film deposition is carried out preferably while rotating the substrate 1 by a rotator.

Since the substrate with a multilayer reflective film of the present invention employs the substrate with a conductive film of the present invention, at a time of forming the multilayer reflective film while the substrate with a conductive film is fixed onto an electrostatic chuck, generation of particles due to abrasion between the electrostatic chuck and the conductive film 2 is prevented. Accordingly, the substrate with a multilayer reflective film is excellent in that it has extremely low surface defects due to particles.

In the above-described substrate with a conductive film of the present invention, a CrON type film corresponding to the upper layer 22 was formed by forming a CrN type film corresponding to the lower layer 21, followed by heating at a temperature of from 110 to 170° C. for a heating time of from 15 to 40 minutes, however, such formation of a CrON type film based on the heating step may be after preparing the substrate with a multilayer reflective film. Namely, after forming a CrN type film corresponding to the lower layer 21, a multilayer reflective film may be formed by using the substrate with a conductive film in such a state that an inevitable natural oxide film is added, as clamped by an electrostatic chuck, and then, the substrate with a conductive film after forming the multilayer reflective layer may be dismounted from the electrostatic chuck and heated, in such a state that the conductive film surface is exposed, at a temperature of from 110 to 170° C. for a heating time of from 15 to 40 minutes, to form a CrON type film corresponding to the upper layer 22. Here, the substrate with a multilayer reflective film may be one having a protective layer as mentioned above. When it has a protective layer, the heat treatment may be conducted after forming the multilayer reflective film and before forming the protective layer, or the heat treatment may be conducted after forming the protective layer.

Here, at least in steps subsequent to the step of forming the multilayer reflective film, such as a step of preparing an EUV mask blank from the substrate with a multilayer reflective film, a step of preparing an EUV mask from the EUV mask blank by forming a pattern by e.g. electron beam irradiation, and further a step of exposing e.g. a silicon wafer by means of the EUV mask, the contact between the conductive film 2 and the electrostatic chuck is improved, whereby generation of particles due to abrasion between the electrostatic chuck and the substrate is prevented.

Here, with a view to preventing generation of particles due to abrasion between the electrostatic chuck and the conductive film 2, it is most preferred to conduct the heat treatment before the film deposition of the multilayer reflective film i.e. at the stage of the substrate with a conductive film.

In such a case, i.e. even in the state of the substrate with a multilayer reflective film, for the same reason as for the above-described substrate with a conductive film of the present invention, the temperature for the heat treatment is more preferably from 115° C. to 160° C., further preferably from 120° C. to 150° C. Further, the heating time is more preferably within a range of from 18 to 35 minutes, and under such conditions, it is possible to obtain a CrON type film having a standard deviation of the film thickness distribution being at most 0.18 nm.

Figure 3:
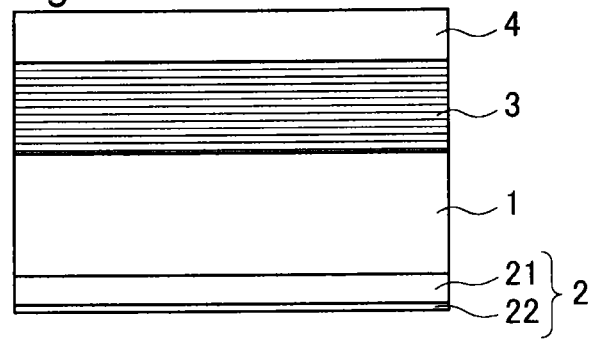
FIG. 3 is a schematic view illustrating an EUV mask blank of the present invention.

Now, the EUV mask blank of the present invention will be described. FIG. 3 is a schematic view illustrating an EUV mask blank of the present invention. In FIG. 3, an absorber layer 4 is provided on a multilayer reflective film 3. Here, a substrate 1, a conductive film 2 and the multilayer reflective film 3 are ones shown in FIG. 2 (the substrate with a multilayer reflective film of the present invention). The EUV mask blank of the present invention can be obtained by fixing the substrate with a multilayer reflective film of the present invention on an electrostatic chuck, and forming the absorber layer 4 on the multilayer reflective film 3 by using a sputtering method such as a magnetron sputtering method or an ion beam sputtering method. Here, in a case where, as mentioned above, the substrate with a multilayer reflective film has a protective layer on the multilayer reflective film 3, the EUV mask blank of the present invention is obtainable by forming an absorber layer 4 on the protective layer.

In the EUV mask blank of the present invention, the material for the absorber layer 4 to be formed on the multilayer reflective film 3 may, for example, be a material having a high absorption coefficient for EUV light, specifically, Cr, Ta, Pd or a nitride thereof. Among them, a material containing at least one of Ta and Pd as the main component is preferred for the reason that the absorber layer 4 tends to be in an amorphous state, the absorber layer 4 will have a surface having excellent smoothness and having a small surface roughness. In this specification, a material containing at least one of Ta and Pd as the main component means a material containing at least 40 at %, preferably at least 50 at %, more preferably at least 55 at %, of at least one of Ta and Pd. Here, the material may contain both of Ta and Pd, and TaPd may be exemplified.

The material containing at least one of Ta and Pd as the main component to be used for the absorber layer 4 may contain, in addition to Ta or Pd, at least one element selected from the group consisting of Hf, Si, Zr, Ge, B, N and H. Specific examples of a material containing the above element in addition to Ta or Pd include TaN, TaNH, PdN, PdNH, TaPdN, TaPdNH, TaHf, TaHfN, TaBSi, TaBSiH, TaBSiN, TaBSiNH, TaB, TaBH, TaBN, TaBNH, TaSi, TaSiN, TaGe, TaGeN, TaZr and TaZrN.

The thickness of the absorber layer 4 is preferably from 40 to 100 nm. The method for forming the absorber layer 4 is not particularly limited so long as it is a sputtering method, and it may be a magnetron sputtering method or an ion beam sputtering method.

When a TaN layer is formed as the absorber layer by an ion beam sputtering method, it is formed preferably to have a thickness of from 40 to 100 nm using a Ta target as a target and a $N_2$ gas (gas pressure: $1.3 \times 10^{-2}$ Pa to $2.7 \times 10^{-2}$ Pa) as a sputtering gas under a voltage of form 300 to 1,500 V at a deposition rate of from 0.01 to 0.1 nm/sec.

In the process of forming the absorber layer 4 by using a sputtering method, in order to obtain a uniform film, film deposition is carried out preferably while rotating the substrate 1 by using a rotator.

In the EUV mask blank of the present invention, a buffer layer may be present between the multilayer reflective film 3 and the absorber layer 4.

A material constituting the buffer layer may, for example, be Cr, Al, Ru, Ta or a nitride thereof, or $SiO_2$, $Si_3N_4$ or $Al_2O_3$. The thickness of the buffer layer is preferably from 10 to 60 nm.

Further, in the EUV mask blank, a low reflective layer (not shown in the drawings) may be formed on the absorber layer 4. By forming a low reflective layer (not shown in the drawings) on the absorber layer 4, the contrast at the time of inspection becomes good. In other words, the light reflectance at the wavelength of inspection light becomes very low. With the low reflective layer formed for such a purpose, at the time of irradiation with light in a wavelength range of inspection light, the maximum light reflectance at the wavelength of inspection light is preferably at most 15%, more preferably at most 10%, further preferably at most 5%.

Since the EUV mask blank of the present invention employs the substrate with a multilayer reflective film of the present invention, the multilayer reflective film has extremely few surface defects due to particles. Moreover, at a time of forming the absorber layer while the substrate with a multilayer reflective film is fixed onto an electrostatic chuck, it is possible to prevent generation of particles due to abrasion between the electrostatic chuck and the conductive film 2. Accordingly, the absorber layer also has extremely few surface defects due to particles.

Further, forming of the CrON type film may be after the preparation of the EUV mask blank. That is, after forming a CrN type film corresponding to the lower layer 21, by using the substrate with a conductive film in such a state that an inevitable natural oxide film is added, as clamped by an electrostatic chuck, a multilayer reflective film and an absorber layer, and, as the case requires, a protective layer, a buffer layer and a low reflective layer, may be formed to prepare an EUV mask blank, and then, the EUV mask blank may be dismounted from the electrostatic chuck and heated, in such a state that the conductive film surface is exposed, at a temperature of from 110 to 170° C. for a heating time of from 15 to 40 minutes, to form a CrON type film corresponding to the upper layer 22. At that time, at least in steps subsequent to the step of preparing the EUV mask blank, such as a step of preparing an EUV mask from the EUV mask blank by forming a pattern by e.g. electron beam irradiation, and a step of exposing e.g. a silicon wafer by means of the EUV mask, the contact between the conductive film 2 and the electrostatic chuck is improved, whereby generation of particles due to abrasion between the electrostatic chuck and the substrate is prevented.

However, with a view to preventing generation of particles due to abrasion between the electrostatic chuck and the conductive film 2, it is most preferred to conduct the heat treatment before forming the multilayer reflective film i.e. at the stage of the substrate with a conductive film.

In such a case, i.e. even in a state after preparing the EUV mask blank, for the same reason as for the above-described substrate with a conductive film of the present invention, the temperature for the heat treatment is more preferably from 115° C. to 160° C., further preferably from 120° C. to 150° C. Further, the heating time is more preferably within a range of from 18 to 35 minutes, and under such conditions, it is possible to obtain a CrON type film having a standard deviation of the film thickness distribution being at most 0.18 nm.

By patterning such an EUV mask blank, it is possible to form an EUV mask having less surface defects. By reducing such defects, exposure with less defects is possible, and the productivity will be excellent.

EXAMPLES

Now, the present invention will be described in further detail with reference to Examples. However, it should be understood that the present invention is by no means restricted to such specific Examples.

Example 1

In this Example, a substrate with a conductive film as shown in FIG. 1, i.e. a substrate with a conductive film comprising a substrate 1 and a two-layer structure conductive film 2 (CrN type film constituting lower layer 21, CrON type film constituting upper layer 22) formed on one surface of the substrate 1, was prepared. Further, a CrO type film constituting a second lower layer was formed between the substrate 1 and the CrN type film constituting the lower layer 21.

A glass substrate of $SiO_2$—$TiO_2$ glass (external dimensions: 6 inches (152.4 mm) square, thickness: 6.3 mm) was used as the substrate 1 for film deposition. This glass substrate has a thermal expansion coefficient of $0.02 \times 10^{-7}$/° C. (at 20° C., this condition is applicable hereinafter) and a Young's modulus of 67 GPa. This glass substrate was polished to have a smooth surface having a surface roughness (rms) of at most 0.15 nm and a flatness of at most 100 nm.

Formation of CrO Type Film

On the surface of the substrate 1, a CrOH film as a second lower layer was deposited by using a magnetron sputtering method. Specifically, after a deposition chamber was evacuated of air to be at most $1 \times 10^{-4}$ Pa, magnetron sputtering was carried out by using a Cr target in an atmosphere of a mixed gas of Ar, $O_2$ and $H_2$, to form a CrOH film of 15 nm thick. The deposition conditions for the CrOH film are as follows.

Target: Cr target
Sputtering gas: mixed gas of Ar, $O_2$ and $H_2$ (Ar: 29.1 vol %, $O_2$: 70 vol %, $H_2$: 0.9 vol %, gas pressure: 0.1 Pa)
Input power: 1,500 W
Deposition rate: 0.23 nm/sec
Film thickness: 15 nm Compositional Analysis of CrO Type Film The composition of the CrO type film was measured by using an X-ray photoelectron spectrometer (manufactured by PERKIN ELMER-PHI) and a Rutherford back scattering spectroscopy (manufactured by Kobe Steel, Ltd.). The compositional ratio (at %) of the CrOH film was CrO:H=71.8:27.9:0.3.

State of CrO Type Film

The state of the CrO type film was confirmed by an X-ray diffractometer (manufactured by RIGAKU Corporation). Since no sharp peak was observed among the diffraction peaks obtained, it was confirmed that the state of the CrO type film was an amorphous structure or a microcrystal structure.

Formation of CrN type film Then, on the CrO type film, a CrNH film as a lower layer 21 was deposited by a magnetron sputtering method. Specifically, after a deposition chamber was evacuated of air to be at most $1 \times 10^{-4}$ Pa, magnetron sputtering was carried out by using a Cr target in an atmosphere of a mixed gas of Ar, $N_2$ and $H_2$ to form a CrNH film of 185 nm thick. The deposition conditions for the CrNH film are as follows.

Target: Cr target
Sputtering gas: mixed gas of Ar, $N_2$ and $H_2$ (Ar: 58.2 vol %, $N_2$: 40 vol %, $H_2$: 1.8 vol %, gas pressure: 0.1 Pa)
Input power: 1,500 W
Deposition rate: 0.18 nm/sec
Film thickness: 185 nm Compositional Analysis of CrN Type Film In the same procedure as for the CrO type film, the composition of the CrN type film was measured by an X-ray photoelectron spectrometer. The compositional ratio (at %) of the CrN type film was Cr:N:H=86.0:13.7:0.3.

State of CrN Type Film

In the same procedure as for the CrO type film, the state of the CrN type film was confirmed by an X-ray diffractometer. Since no sharp peak was observed among the diffraction peaks obtained, it was confirmed that the state of the CrN type film was an amorphous structure or a microcrystal structure.

Formation of CrON Type Film

After forming the CrN type film, it was heat-treated in the atmospheric air within a range of 140±4° C. for 20 minutes to form a CrON type film.

Compositional Analysis of CrON Type Film

In the same procedure as for the CrO type film, the composition of the CrON type film was measured by an X-ray photoelectron spectrometer. The compositional ratio (at %) of the CrON type film was CrO:N:H=72.2:22:5.5:0.3.

State of CrON Type Film

In the same procedure as for the CrO type film, the state of the CrON type film was confirmed by an X-ray diffractometer. Since no sharp peak was observed among the diffraction peaks obtained, it was confirmed that the state of the CrON type film was an amorphous structure or a microcrystal structure.

Film Thickness Distribution of CrON Type Film

The film thickness of the CrON type film was measured by using an X-ray reflectance analyzer at 7 coordinate points of (0, 0), (11, 11), (22, 22), (33, 33), (44, 44), (55, 55) and (66, 66) when the substrate center was taken as the origin, and straight lines parallel to the sides of the substrate were taken as X-axis and Y-axis, respectively. Here, the unit in the brackets ( ) is mm. The results of the measurement of the film thickness of the CrON type film were from 1.80 nm to 1.93 nm. From the results of the measurement, the average film thickness of the CrON type film and the standard deviation of the film thickness distribution were obtained. The average film thickness of the CrON type film was 1.9 nm, and the standard deviation of the film thickness distribution was 0.05 nm.

Surface Roughness (Rms) of Conductive Film 2

The surface roughness of the conductive film 2 formed by the above procedure was measured by using an atomic force microscope (L-Trace II, manufactured by Hitachi High-Tech Science Corporation) in dynamic force mode. The area for measurement for surface roughness was 20 μm×20 μm, and SI-DF40 (manufactured by Hitachi High-Tech Science Corporation) was used as a cantilever. The surface roughness (rms) of the conductive film 2 was 0.095 nm.

Example 2

In this Example, a substrate with a conductive film as shown in FIG. 1, i.e. a substrate with a conductive film comprising a substrate 1 and a two-layer structure conductive film 2 (CrN type film constituting lower layer 21, CrON type film constituting upper layer 22) formed on one surface of the substrate 1, is prepared. Further, a CrO type film constituting a second lower layer is formed between the substrate 1 and the CrN type film constituting the lower layer 21.

The same glass substrate of $SiO_2$—$TiO_2$ glass as in Example 1 is used as the substrate 1 for film deposition.

Formation of CrO Type Film

On the surface of the substrate 1, a CrOH film as a second lower layer is deposited by using the same method as in Example 1.

Compositional Analysis of CrO Type Film

The composition of the CrO type film is measured by using the same method as in Example 1. The compositional ratio (at %) of the CrOH film is CrO:H=71.8:27.9:0.3.

State of CrO Type Film

The state of the CrO type film is confirmed by the same method as in Example 1. Since no sharp peak is observed among the diffraction peaks obtained, it is confirmed that the crystal state of the CrO type film is an amorphous structure or a microcrystal structure.

Formation of CrN Type Film

Then, on the CrO type film, a CrNH film of 70 nm thick is deposited by the same method as in Example 1.

Compositional Analysis of CrN Type Film

In the same procedure as for the CrO type film, the composition of the CrN type film is measured by an X-ray photoelectron spectrometer. The compositional ratio (at %) of the CrN type film is Cr:N:H=86.0:13.7:0.3.

State of CrN Type Film

In the same procedure as for the CrO type film, the state of the CrN type film is confirmed by an X-ray diffractometer. Since no sharp peak is observed among the diffraction peaks obtained, it is confirmed that the state of the CrN type film is an amorphous structure or a microcrystal structure.

Formation of CrON Type Film

After forming the CrN type film, it is heat-treated in the atmospheric air within a range of 120±4° C. for 15 minutes to form a CrON type film.

Compositional Analysis of CrON Type Film

In the same procedure as for the CrO type film, the composition of the CrON type film is measured by an X-ray photoelectron spectrometer. The compositional ratio (at %) of the CrON type film is CrO:N:H=79.1:11:9.6:0.3.

State of CrON Type Film

In the same procedure as for the CrO type film, the state of the CrON type film is confirmed by an X-ray diffractometer. Since no sharp peak is observed among the diffraction peaks obtained, it is confirmed that the state of the CrON type film is an amorphous structure or a microcrystal structure.

Film Thickness Distribution of CrON Type Film

The film thickness of the CrON type film is measured by the same method as in Example 1. The results of the measurement of the film thickness of the CrON type film are from 0.80 nm to 0.93 nm. From the results of the measurement, the average film thickness of the CrON type film and the standard deviation of the film thickness distribution are obtained. The average film thickness of the CrON type film is 0.9 nm, and the standard deviation of the film thickness distribution is 0.05 nm.

Surface Roughness (Rms) of Conductive Film 2

The surface roughness of the conductive film 2 formed by the above procedure is measured by the same method as in Example 1. The surface roughness (rms) of the conductive film 2 is 0.090 nm.

Example 3

In this Example, a substrate with a conductive film as shown in FIG. 1, i.e. a substrate with a conductive film comprising a substrate 1 and a two-layer structure conductive film 2 (CrN type film constituting lower layer 21, CrON type film constituting upper layer 22) formed on one surface of the substrate 1, is prepared. Further, a CrO type film constituting a second lower layer is formed between the substrate 1 and the CrN type film constituting the lower layer 21.

The same glass substrate of $SiO_2$—$TiO_2$ glass as in Example 1 is used as the substrate 1 for film deposition.

Formation of CrO Type Film

On the surface of the substrate 1, a CrOH film as a second lower layer is deposited by using the same method as in Example 1.

Compositional Analysis of CrO Type Film

The composition of the CrO type film is measured by using the same method as in Example 1. The compositional ratio (at %) of the CrOH film is CEO:H=71.8:27.9:0.3.

State of CrO Type Film

The state of the CrO type film is confirmed by the same method as in Example 1. Since no sharp peak is observed among the diffraction peaks obtained, it is confirmed that the crystal state of the CrO type film is an amorphous structure or a microcrystal structure.

Formation of CrN Type Film

Then, on the CrO type film, a CrNH film of 500 nm thick is deposited by the same method as in Example 1 except for deposition conditions. The deposition conditions for the CrNH film are as follows.

Target: Cr target

Sputtering gas: mixed gas of Ar, $N_2$ and $H_2$ (Ar: 38.8 vol %, $N_2$: 60.0 vol %, $H_2$: 1.2 vol %, gas pressure: 0.1 Pa)

Input power: 1,500 W
Deposition rate: 0.12 nm/sec
Film thickness: 500 nm

Compositional Analysis of CrN Type Film

In the same procedure as for the CrO type film, the composition of the CrN type film is measured by an X-ray photoelectron spectrometer. The compositional ratio (at %) of the CrN type film is Cr:N:H=63.7:36.0:0.3.

State of CrN Type Film

In the same procedure as for the CrO type film, the state of the CrN type film is confirmed by an X-ray diffractometer. Since no sharp peak is observed among the diffraction peaks obtained, it is confirmed that the state of the CrN type film is an amorphous structure or a microcrystal structure.

Formation of CrON Type Film

After forming the CrN type film, it is heat-treated in the atmospheric air within a range of 160±4° C. for 40 minutes to form a CrON type film.

Compositional Analysis of CrON Type Film

In the same procedure as for the CrO type film, the composition of the CrON type film is measured by an X-ray photoelectron spectrometer. The compositional ratio (at %) of the CrON type film is CrO:N:H=33.9:42.4:23.4:0.3.

State of CrON Type Film

In the same procedure as for the CrO type film, the state of the CrON type film is confirmed by an X-ray diffractometer. Since no sharp peak is observed among the diffraction peaks obtained, it is confirmed that the state of the CrON type film is an amorphous structure or a microcrystal structure.

Film Thickness Distribution of CrON Type Film

The film thickness of the CrON type film is measured by the same method as in Example 1. The results of the measurement of the film thickness of the CrON type film are from 2.80 nm to 2.93 nm. From the results of the measurement, the average film thickness of the CrON type film and the standard deviation of the film thickness distribution are obtained. The average film thickness of the CrON type film is 2.9 nm, and the standard deviation of the film thickness distribution is 0.05 nm.

Surface Roughness (Rms) of Conductive Film 2

The surface roughness of the conductive film 2 formed by the above procedure is measured by the same method as in Example 1. The surface roughness (rms) of the conductive film 2 is 0.100 nm.

Comparative Example 1

After forming the CrN type film, without carrying out the heat treatment, it was left at room temperature for 300 minutes in the atmospheric air, whereupon the composition at the surface of the CrN type film was measured by using an X-ray photoelectron spectrometer. As a result, it was confirmed that a CrON type film having a compositional ratio (at %) of CrO:N:H=72.2:22:5.5:0.3 was formed on the CrN type film surface.

Film Thickness Distribution of CrON Type Film

The film thickness of the CrON type film was measured by using an X-ray reflectance analyzer at 7 coordinate points of (0, 0), (11, 11), (22, 22), (33, 33), (44, 44), (55, 55) and (66, 66) when the substrate center was taken as the origin. From the results of the measurement, the average film thickness of the CrON type film and the standard deviation of the film thickness distribution were obtained. The average film thickness of the CrON type film was 1.1 nm, and the standard deviation of the film thickness distribution was 0.23 nm.

Surface Roughness (Rms) of Conductive Film 2

The surface roughness of the conductive film 2 formed by the above procedure was measured by using an atomic force microscope (L-Trace II, manufactured by Hitachi High-Tech Science Corporation) in dynamic force mode. The area for measurement for surface roughness was 20 μm×20 μm, and SI-DF40 (manufactured by Hitachi High-Tech Science Corporation) was used as a cantilever. The surface roughness (rms) of the conductive film 2 was 0.122 nm.

Comparative Example 2

After forming the CrN type film, without carrying out the heat treatment, it was left at room temperature for 15 months in the atmospheric air, whereupon the composition at the surface of the CrN type film was measured by using an X-ray photoelectron spectrometer. As a result, it was confirmed that a CrON type film having a compositional ratio (at %) of CrO:N:H=72.2:22:5.5:0.3 was formed on the CrN type film surface.

Film Thickness Distribution of CrON Type Film

The film thickness of the CrON type film was measured by using an X-ray reflectance analyzer at 7 coordinate points of (0, 0), (11, 11), (22, 22), (33, 33), (44, 44), (55, 55) and (66, 66) when the substrate center was taken as the origin. From the results of the measurement, the average film thickness of the CrON type film and the standard deviation of the film thickness distribution were obtained. The average film thickness of the CrON type film was 1.6 nm, and the standard deviation of the film thickness distribution was 0.19 nm.

Surface Roughness (Rms) of Conductive Film 2

The surface roughness of the conductive film 2 formed by the above procedure was measured by using an atomic force microscope (L-Trace II, manufactured by Hitachi High-Tech Science Corporation) in dynamic force mode. The area for measurement for surface roughness was 20 μm×20 μm, and SI-DF40 (manufactured by Hitachi High-Tech Science Corporation) was used as a cantilever. The surface roughness (rms) of the conductive film 2 was 0.122 nm.

Comparative Example 3

After forming the CrN type film, it is heat-treated at a temperature within a range of 200±4° C. for 120 minutes in the atmospheric air, whereupon the composition at the surface of the CrN type film is measured by using an X-ray photoelectron spectrometer. As a result, it is confirmed that a CrON type film having a compositional ratio (at %) of Cr:O:N:H=72.2:22:5.5:0.3 is formed on the CrN type film surface.

Film Thickness Distribution of CrON Type Film

The film thickness of the CrON type film is measured by the same method as in Comparative Example 1. From the results of the measurement, the average film thickness of the CrON type film and the standard deviation of the film thickness distribution are obtained. The average film thickness of the CrON type film is 3.2 nm, and the standard deviation of the film thickness distribution is 0.19 nm.

Surface Roughness (Rms) of Conductive Film 2

The surface roughness of the conductive film 2 formed by the above procedure is measured by the same method as in Comparative Example 1. The surface roughness (rms) of the conductive film 2 is 0.132 nm.

REFERENCE SYMBOLS

1: substrate
2: conductive film

21: lower layer
22: upper layer
3: multilayer reflective film
4: absorber layer

The entire disclosure of Japanese Patent Application No. 2014-088406 filed on Apr. 22, 2014 including specification, claims, drawings and summary is incorporated herein by reference in its entirety.

What is claimed is:

1. A substrate with a conductive film to be used for producing a reflective mask blank for EUV lithography, comprising a substrate and a conductive film formed on the substrate;
wherein the conductive film has at least two layers of a layer (lower layer) formed over the substrate side and a layer (upper layer) formed on the lower layer;
the lower layer of the conductive film is a CrN type film which contains chromium (Cr) and nitrogen (N);
the upper layer of the conductive film is a CrON type film which contains Cr, N and oxygen (O);
in the CrN type film, the total content of Cr and N is at least 85 at %, and the compositional ratio (atomic ratio) of Cr to N is Cr:N=9.5:0.5 to 3:7;
in the CrON type film, the total content of Cr, N and O is at least 85 at %, and the compositional ratio (atomic ratio) of Cr to (N+O) is Cr:(N+O)=9.5:0.5 to 3:7; and
the film thickness of the CrON type film is from 0.5 to 3 nm, and the standard deviation of the film thickness distribution of the CrON type film is at most 0.18 nm.

2. The substrate with a conductive film according to claim 1, wherein the conductive film further has a second lower layer between the above lower layer and the substrate; the second lower layer is a CrO type film which contains Cr and O; and in the CrO type film, the total content of Cr and O is at least 85 at %, and the compositional ratio (atomic ratio) of Cr to O is Cr:O=9:1 to 3:7.

3. The substrate with a conductive film according to claim 1, wherein each layer constituting the conductive film further contains at least one element selected from the group consisting of H, B, Al, Ag, Co, Cu, Fe, Hf, In, Mo, Ni, Nb, Si, Ta, Ti, Zn and Zr in a total content of at most 15 at %.

4. The substrate with a conductive film according to claim 1, wherein the film thickness of the lower layer is from 50 to 500 nm.

5. The substrate with a conductive film according to claim 2, wherein the film thickness of the second lower layer is from 1 to 30 nm.

6. The substrate with a conductive film according to claim 1, wherein the sheet resistance of the conductive film is at most 20 Ω/□.

7. The substrate with a conductive film according to claim 1, wherein the lower layer of the conductive film is in an amorphous state.

8. The substrate with a conductive film according to claim 1, wherein the upper layer of the conductive film is in an amorphous state.

9. The substrate with a conductive film according to claim 2, wherein the second lower layer of the conductive film is in an amorphous state.

10. The substrate with a conductive film according to claim 1, wherein the surface roughness (rms) of the upper layer of the conductive film is at most 0.5 nm.

11. A substrate with a multilayer reflective film for a reflective mask blank for EUV lithography, comprising the substrate with a conductive film as defined in claim 1, and a multilayer reflective film formed on a surface of the substrate opposite to the surface on which the conductive film is formed.

12. A reflective mask blank for EUV lithography, comprising the substrate with a multilayer reflective film as defined in claim 11, and an absorber layer formed on the multilayer reflective film.

13. A reflective mask for EUV lithography produced by patterning the reflective mask blank for EUV lithography as defined in claim 12.

14. A method for producing a substrate with a conductive film to be used for producing a reflective mask blank for EUV lithography, which comprises forming a CrN type film containing chromium (Cr) and nitrogen (N) on a substrate by means of a sputtering method, and then, heat-treating the CrN type film at a temperature of from 110 to 170° C.

15. A method for producing a substrate with a conductive film to be used for producing a reflective mask blank for EUV lithography, which comprises forming a CrO type film containing chromium (Cr) and oxygen (O) on a substrate and forming a CrN type film containing chromium (Cr) and nitrogen (N) on the CrO type film, by means of a sputtering method, and then, heat-treating the CrN type film at a temperature of from 110 to 170° C.

16. A method for producing a substrate with a multilayer reflective film to be used for producing a reflective mask blank for EUV lithography, which comprises forming a CrN type film containing chromium (Cr) and nitrogen (N) on a substrate and forming a multilayer reflective film to reflect EUV light on a substrate surface opposite to the surface on which the CrN type film is formed, by means of a sputtering method, and then, heat-treating the CrN type film at a temperature of from 110 to 170° C.

17. A method for producing a substrate with a multilayer reflective film to be used for producing a reflective mask blank for EUV lithography, which comprises forming a CrO type film containing chromium (Cr) and oxygen (O) on a substrate, forming a CrN type film containing chromium (Cr) and nitrogen (N) on the CrO type film, and forming a multilayer reflective film to reflect EUV light on a substrate surface opposite to the surface on which the CrN type film is formed, by means of a sputtering method, and then, heat-treating the CrN type film at a temperature of from 110 to 170° C.

18. The method for producing a substrate with a multilayer reflective film according to claim 16, wherein a protective layer is formed on the multilayer reflective film.

19. The method for producing a substrate with a multilayer reflective film according to claim 18, wherein after the protective layer is formed, the CrN type film is heat-treated at a temperature of from 110 to 170° C.

20. A method for producing a reflective mask blank for EUV lithography, which comprises forming a CrN type film containing chromium (Cr) and nitrogen (N) on a substrate, forming a multilayer reflective film to reflect EUV light on a substrate surface opposite to the surface on which the CrN type film is formed and forming an absorber layer to absorb EUV light on the multilayer reflective film, by means of a sputtering method, and then, heat-treating the CrN type film at a temperature of from 110 to 170° C.

21. A method for producing a reflective mask blank for EUV lithography, which comprises forming a CrO type film containing chromium (Cr) and oxygen (O) on a substrate, forming a CrN type film containing chromium (Cr) and nitrogen (N) on the CrO type film, forming a multilayer reflective film to reflect EUV light on a substrate surface opposite to the surface on which the CrN type film is formed and forming an absorber layer to absorb EUV light on the multilayer reflective film, by means of a sputtering method, and then, heat-treating the CrN type film at a temperature of from 110 to 170° C.

22. The method for producing a reflective mask blank for EUV lithography according to claim 20, wherein a protective layer is formed on the multilayer reflective film, and an absorber layer is formed on the protective layer.

* * * * *